United States Patent [19]

Hayashi

[11] 4,267,436

[45] May 12, 1981

[54] INTERVAL-EXPANDING TIMER COMPENSATED FOR DRIFT AND NONLINEARITY

[76] Inventor: Mishio Hayashi, 1280-35, Minaminakamaru, Omiya-shi, Saitama-ken, Japan

[21] Appl. No.: 972,355

[22] Filed: Dec. 22, 1978

[30] Foreign Application Priority Data

Dec. 26, 1977 [JP] Japan .............................. 52/155688
Dec. 26, 1977 [JP] Japan .............................. 52/155690

[51] Int. Cl.$^3$ .............................. H03K 17/28

[52] U.S. Cl. .............................. 235/92 T; 235/92 TF; 235/92 FQ; 328/129

[58] Field of Search .............. 324/181, 186; 235/92 T, 235/92 TF, 92 FQ; 307/267; 328/58, 151, 129; 368/107, 108, 155

[56] References Cited

U.S. PATENT DOCUMENTS 3,229,201 1/1966 Curtis et al. .............................. 324/186
3,668,529 6/1972 Meyer .

OTHER PUBLICATIONS

Murthy et al., "On Improved Digital Techniques of Pulse Width Measure", 5/1973, J. Inse Telecommun. Eng. (India), vol. 19, No. 5, pp. 242-245.

Rarity et al., "The Digital Measure of Pulse Width", 1958, Proceedings of The National Electronics Conference, vol. 13, pp. 773-782.

*Primary Examiner*—Gerard R. Strecker
*Assistant Examiner*—Walter E. Snow
*Attorney, Agent, or Firm*—Staas & Halsey

[57] ABSTRACT

A plurality of closely spaced, very short time intervals are supplied to a time-voltage converter to be converted to corresponding voltages one after another. These converted voltages are sequentially supplied to different voltage holders. The voltages held by the voltage holders are applied, via a changeover switch, to a common voltage-time converter in a sequential order. The conversion characteristic of the voltage-time converter is so selected as to convert the input voltage to a time interval longer than the original one. A count is taken by a counter of the output from the voltage-time converter, thereby measuring each of the original time intervals.

16 Claims, 9 Drawing Figures

INTERVAL-EXPANDING TIMER COMPENSATED FOR DRIFT AND NONLINEARITY

BACKGROUND OF THE INVENTION

This invention relates to a time interval measuring instrument for measuring a time interval, in particular, a very short time interval, with high accuracy by counting clock pulses.

A method that has heretofore been employed for measuring a time interval involves counting of the number of clock pulses occurring in the time interval to be measured. In this case, the higher the clock pulse frequency is, the greater the measurement accuracy is. But it is impossible to use a clock pulse whose frequency is higher than the resolution of a counter for counting the clock pulses, and a counter capable of counting clock pulses of high frequency is expensive.

To avoid the above defect, there has been employed a method in which the time interval to be measured is converted to a voltage, this voltage is converted again to a time interval longer than the original one, and then a count is taken of the number of clock pulses occurring in the expanded time interval. With this method, as compared with the case of such conversion being not effected, it is possible to increase the measurement accuracy by a multiple ratio of the expanded time interval to the original one if the clock pulse frequencies used are the same. Conversely, if the measurement accuracy required is the same, the clock pulse frequency used can be reduced, and consequently an inexpensive counter can be employed.

In time interval measurements involving such time expansion, however, if a plurality of time intervals to be measured are successively applied in a relatively close relationship, then before measurement of one of the incoming time intervals by conversion is completed, the next successive time interval to be measured occurs, so that these plural time intervals cannot be measured by the same converter. It is also possible to measure the time interval to be measured by converting it to a voltage and further converting the voltage to a digital signal by a method which is different from the method of the type involving counting clock pulses. In this instance, a plurality of time intervals, even if occurring in a relatively close relationship, can be measured by the employment of a high-speed A-D converter. But such an A-D converter is very expensive.

For measuring a plurality of time intervals occurring relatively close together by the method of the type involving counting of clock pulses, one might consider preparing pluralities of voltage-time converters and counters, applying the time intervals converted to voltage to the individual voltage-time converters, respectively, and counting the numbers of clock pulses by the individual counters for the expanded time intervals. With this method, however, the measuring instrument involves parallel connections of pluralities of voltage-time converters, and counters and hence is expensive. In addition, the conversion characteristics of the voltage-time converters are subject to aging and variations due to ambient temperature change and must be housed, for example, in a constant-temperature oven so as to prevent such variations, resulting in the measuring instrument becoming markedly bulky and expensive. Moreover, it is difficult to keep the conversion characteristics of the voltage-time converters constant at all times, so that their measured outputs fluctuate.

For counting high-frequency clock pulses during a relatively long time interval to be measured, the counter to be used is required to have an enormous number of stages, and hence is costly. If the clock pulse frequency is reduced, the number of stages of the counter may be small but the measurement accuracy drops. In view of this, in order to increase the measurement accuracy, there has been employed a method in which the number of clock pulses of a relatively low frequency is counted during the time to be measured, and the time intervals between the start of the time to be measured and the next successive clock pulse, and between the end of the time to be measured and the next successive clock pulse, are measured by using clock pulses of a higher frequency, or these time intervals are expanded and the number of clock pulses of a relatively low frequency is measured during each of the time intervals. Such a measuring method is disclosed, for example, in U.S. Pat. No. 3,133,189, issued May 12, 1964. With this method, however, it is necessary to house a time-voltage converter and a voltage-time converter in a constant-temperature oven so as to protect the measurement from the influence of ambient temperature variations.

It is an object of this invention to provide a time interval measuring instrument which is capable of measuring not only a very short time interval but also a plurality of closely spaced time intervals with high accuracy.

It is another object of this invention to provide a time interval measuring instrument which provides highly accurate measurements of very short time intervals occurring relatively close to each other and which can be constructed at low cost.

It is another object of this invention to provide a time interval measuring instrument which does not employ any constant-temperature oven but enables highly accurate time interval measurements untouched by ambient temperature change.

It is another object of this invention to provide a time interval measuring instrument which enables accurate time interval measurements untouched by nonlinearity of the conversion characteristics of a time-voltage converter and a voltage-time converter.

It is still another object of this invention to provide a time interval measuring instrument which is capable of measuring a relatively long time interval at low cost and with high accuracy.

SUMMARY OF THE INVENTION

According to this invention, time intervals to be measured are each converted by a time-voltage converter to the corresponding voltage. The converted voltages are each supplied via a first changeover switch to a particular one of a plurality of voltage holders for storage therein. The voltages held by the voltage holders are applied via a second changeover switch to a voltage-time converter, which has such a conversion characteristic as to convert the input voltage to a time longer than the original time interval. By taking a count of the number of clock pulses occurring during the expanded time converted by the voltage-time converter, the original time interval is measured. That is, the time interval to be measured is expanded, the expanded time is measured, and then the measured value is multiplied by the ratio of that expansion, by which the original time interval can be measured. In this case, even if the clock pulse frequency used is relatively low, the measurement accuracy can be increased in accordance with the expansion ratio.

In addition, even if a plurality of time intervals to be measured are supplied relatively close to each other, these time intervals are held in the form of voltages in different voltage holders, one of the voltages is converted by a voltage-time converter, a count is taken of the number of clock pulses during the conversion, and then the next voltage is supplied to the same converter. Thus, the plurality of relatively closely spaced time intervals can be measured individually. Further, since the time-voltage converter and the voltage-time converter are used in common with respect to the time intervals to be measured, the conversion characteristics of the converters can be equally compensated for each time interval to be measured, and the same measurement accuracy is achieved. Even if a constant-temperature oven is used, the constant of the measuring instrument is lower than in the case of employing pluralities of converters.

Besides, since such relatively closely spaced time intervals can be measured, even if the conversion characteristic of each of the time-voltage converter and the voltage-time converter varies due to a temperature change, its influence can be removed by measuring each time interval and a predetermined constant time immediately after or before it, and obtaining the ratio of the former to the latter, because the measurement of lack of them is equally subject to the variations in the conversion characteristics of the converters. Accordingly, no constant-temperature oven is needed. On top of that, these closely spaced time intervals can each be measured in a short time by holding the converted voltaged of the time interval and the abovesaid constant time in different voltage holders.

For instance, in the case of emloying an integrator as the time-voltage converter, its conversion characteristics may have nonlinearity in the region corresponding to a very short time interval. In such a case, a very short time interval to be measured enters into the nonlinearity region of the conversion characteristic and no linear conversion takes place, resulting in inaccurate measurement. To avoid this, after a predetermined constant time is added to the time interval to be measured, the combined time interval is measured by the time-voltage and the voltage-time conversion and, at the same time, the constant time is also measured by the time-voltage and the voltage-time conversion. Then, the difference between both measured values is obtained, by which it is possible to achieve accurate measurement free from the influence of the nonlinearity of the conversion characteristics. Also, in this case, accurate measurement can be achieved by relatively closely spacing the time interval to be measured and the constant time, and holding their converted voltages in different voltage holders. This measurement can be achieved by an inexpensive measuring instrument of the type that counts clock pulses.

DESCRIPTION OF THE PREFERRED EMBODIMENTS

Figure 1:
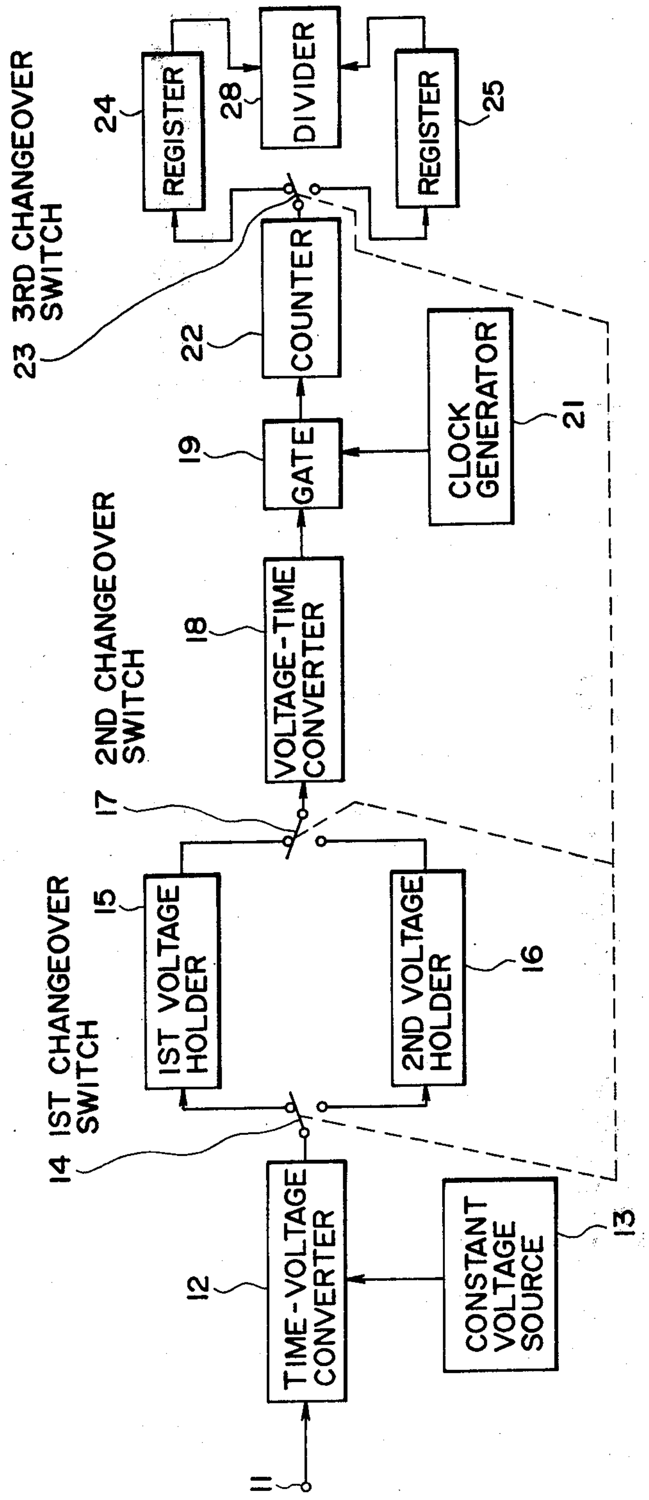
FIG. 1 is a block diagram explanatory of the principle of operation of one embodiment of the time interval measuring instrument according to this invention.
Figure 2:
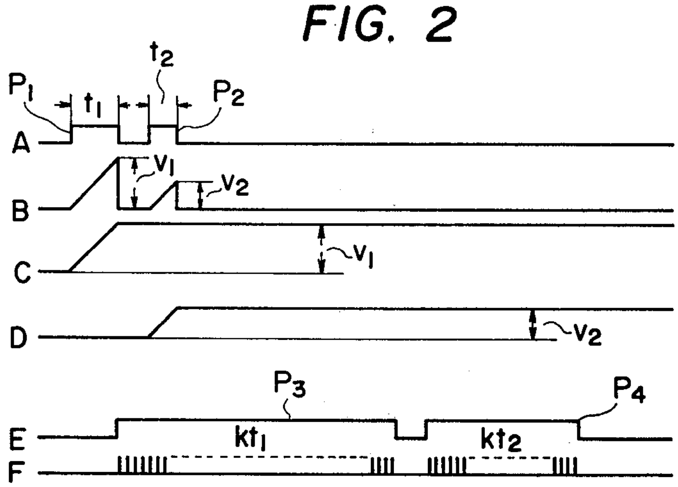
FIG. 2 is a timing chart explanatory of the operation of the example shown in FIG. 1.

Reference is made first to FIGS. 1 and 2 which are a block diagram and timing chart, respectively, of one embodiment of the present invention. Pulses $P_1$ and $P_2$ of time intervals $t_1$ and $t_2$ to be measured, such as shown, for example, in FIG. 2A are relatively close to each other, and are applied to a time-voltage converter 12 via an input terminal 11 in FIG. 1. The time-voltage converter 12 is made up of an integrator, for example, which integrates a constant voltage from a constant voltage source 13 while the time interval to be measured is applied to the converter 12. The integration is reset on the termination of each time interval to be measured. Accordingly, the time-voltage converter 12 derives at its output a voltage $v_1$ proportional to the duration $t_1$ of the pulse $P_1$, as shown in FIG. 2B. The output voltage is provided via a first changeover switch 14 to a first voltage holder 15, and is held therein as depicted in FIG. 2C. The pulse $P_2$ is also converted by the time-voltage converter 12 to a voltage $v_2$ proportional to the duration $t_2$, as shown in FIG. 2B. When the pulse $P_2$ is converted to the voltage $v_2$, the first changeover switch 14 is switched to the side of a second voltage holder 16 and the voltage $v_2$ is held therein, as shown in FIG. 2D.

After completion of the voltage supply to the first voltage holder 15, the output $v_1$ therefrom is provided via a second changeover switch 17 to a voltage-time converter 18, by which the voltage $v_1$ is converted to a time interval which is, for example, 100 or 1000 times as long as the duration $t_1$ of the original pulse $P_1$. This voltage-time conversion is achieved, for instance, by integrating a constant voltage (by means of an integrator) from the start of the conversion, stopping the integration when the integrated voltage reaches the voltage to be converted, i.e. the voltage held by the voltage holder, and then outputting the time interval between the start and the end of the integrating operation. In this manner, the pulse $P_1$ is converted to a pulse $P_3$ of a duration $kt_1$, as shown in FIG. 2E. After this conversion, the second switch 17 is switched to the side of the second voltage holder 16, and then the voltage $v_2$ is similarly converted to a time interval in the form of a pulse $P_4$ having a duration $kt_2$, as shown in FIG. 2E.

Then, a count is taken of the number of clock pulses occurring in the time interval of the pulse width of each of the pulses $P_3$ and $P_4$. That is, a gate 19 is opened by the pulse $P_3$, permitting the passage of clock pulses therethrough from a clock generator 21 to a counter 22. The count value of the counter 22 for the pulse $P_3$ is provided via a third changeover switch 23 to a register 24 for storage therein. Thereafter, when the counter 22 is reset and the gate 19 is opened by the pulse $P_4$, the counting of clock pulses takes place, and the count value is stored in a register 25 via the third switch 23 switched thereto. The clock pulses passing through the gate 19 are such as depicted in FIG. 2F.

As a consequence of the above, numerical values, which are k times the durations $t_1$ and $t_2$ of the pulses $P_1$ and $P_2$, are respectively stored in the registers 24 and 25. In the above example, the time intervals $t_1$ and $t_2$ are made k-fold for measurement. If the same clock pulse is used, the accuracy of measurement can be increased by k times as compared with that in the case where no time expansion being is effected, and conversely if the accuracy of measurement is to be equal to that in the latter case, the clock pulse frequency can be reduced down to 1/k and the counter 22 may be an inexpensive one.

Even if the pulses $P_1$ and $P_2$ representing the time intervals to be measured are relatively close to each other, they can be expanded for measurement. In addition, since the time-voltage converter 12 and the voltage-time converter 18 are used in common with respect to both time intervals to be measured, even if their conversion characteristics are affected by variations in the ambient temperature or the like, the ratios between measured values remain unaffected by such variations.

Figure 3:
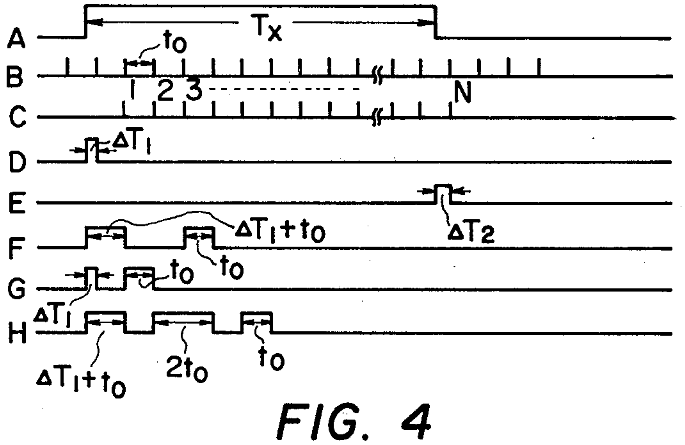
FIG. 3 is a timing chart explanatory of highly accurate measurement of a relatively long time interval.

Next, with reference to FIG. 3, a description will be given in connection with the case of measuring a relatively long time interval with high accuracy according to this invention. With a conventional method for measurement of this kind, clock pulses having a period $t_0$, shown during FIG. 3B, are gated in a time interval Tx to be measured, thereby to obtain a gate output depicted in FIG. 3C, and then a count is taken of the total number N of the gated clock pulses. At the same time, a time interval $\Delta T_1$ between the beginning of the time Tx to be measured and the next successive clock pulse, as shown in FIG. 3D, and a time interval $\Delta T_2$ between the end of the time Tx and the next successive clock pulse, as shown in FIG. 3E, are detected. Then, these detected time intervals $\Delta T_1$ and $\Delta T_2$ are measured by using a clock pulse of a frequency sufficiently higher than the clock pulse of FIG. 3B, or after they are explained. From these measured values, the expression $Nt_0+\Delta T_1-\Delta T_2$ yields as the time interval Tx with high accuracy.

In this case, since the time intervals $\Delta T_1$ and $\Delta T_2$ are very short, if they are expanded as mentioned above, they can be measured with an inexpensive structure. However the time intervals $\Delta T_1$ and $\Delta T_2$ assume values in the range of 0 to $t_0$, and if they are very short time intervals close to 0, they enter into a nonlinear region of the converson characteristic of the time-voltage converter 12 and cannot be measured with high accuracy. A solution of this problem is to add a constant time, for example, $t_0$ to each of the time intervals $\Delta T_1$ and $\Delta T_2$, and to subtract the time $t_0$ from the measured values after measurement. The time $t_0$ to be added is selected to have a value larger with respect to the nonlinear region of the conversion characteristic of the time-voltage converter 12.

Figure 4:
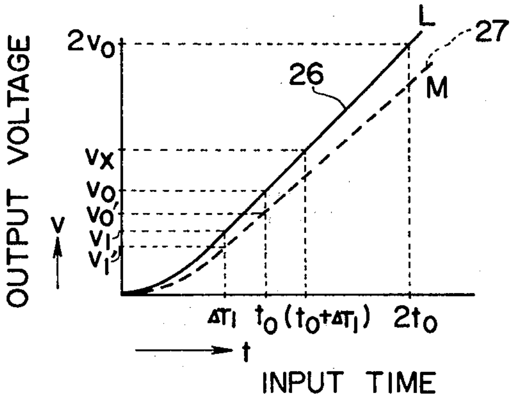
FIG. 4 is a graph showing examples of conversion characteristics of a time-voltage converter used in this invention.

The conversion characteristic of the time-voltage converter 12 exhibits nonlinearity in response to inputs close to zero, but exhibits linearity in response to inputs larger than $t_0$, as indicated by the curve 26 in FIG. 4. In this instance, in the measurement of the time interval $\Delta T_1$, $t_0$ is added to $\Delta T_1$ to obtain $\Delta T_1+t_0$, as shown in FIG. 3F, and this combined time interval is applied to the time-voltage converter 12, that is, it is measured as the pulse $P_1$ of FIG. 2A, and the measured value is stored in the register 24. Further, as shown in FIG. 3F, a pulse of the same duration as the added time interval $t_0$ is produced after the pulse of the duration $\Delta T_1+t_0$ and then applied as the pulse $P_2$ of FIG. 2A to the time-voltage converter 12 for measurement, thereby to obtain the measured value in the register 25. From the measured value of $\Delta T_1+t_0$ stored in the register 24, there is subtracted the measured value of $t_0$ stored in the register 25, by which the time interval $\Delta T_1$ can be measured with high accuracy. In addition, even if the time intervals $\Delta T_1+t_0$ and $t_0$ to be measured are close to each other, they can be measured at high speed. In this case, a reversible counter may be used as the counter 22 instead of storing the measured values in the registers 24 and 25, and in the measurement of the time interval $\Delta T_1+t_0$ the counter 22 is actuated for up-counting, whereas in the measurement of $t_0$ the counter 22 is actuated for down-counting from the counted-up value. Thus, the counter 22 provides the measured value of the time interval $\Delta T_1$.

Even in the case where the conversion characteristic of the time-voltage converter 12 undergoes such a change as from the curve 26 to 27 in FIG. 4 due to a change in the ambient temperature, if the time interval to be measured lies in the linear regions of the curves 26 and 27, it is possible to prevent the influence of the change in the conversion characteristic. To this end, the time interval to be measured is measured as a ratio to a constant time. That is, in FIG. 4, letting $v_1$ represent the converted voltage of the time interval $\Delta T_1$ according to the conversion characteristic curve 26, $v_0$ represent the converted voltage of the constant time $t_0$ and $v_1'$ and $v_0'$ represent respectively the converted values of the time intervals $\Delta T_1$ and $t_0$ according to the conversion characteristic curve 27, the equation $v_1/v_0=v_1'/v_0'$ holds if the time intervals $\Delta T_1$ and $t_0$ lie in the linear regions of the curves 26 and 27. Even if the conversion characteristic changes, the time interval $\Delta T_1$ is measured as a ratio to the constant time $t_0$ without being affected by the characteristic change.

For example, as shown in FIG. 3G, a pulse of the duration $\Delta T_1$ and a pulse of the duration $t_0$ are sequentially applied to the input terminal 11 in FIG. 1 to obtain their measured values in the registers 24 and 25, respectively. These measured values are divided by a divider 28 to obtain $\Delta T_1/t_0$. This method eliminates the necessity of housing the converters 12 and 18 in a constant-temperature oven.

Figure 5:
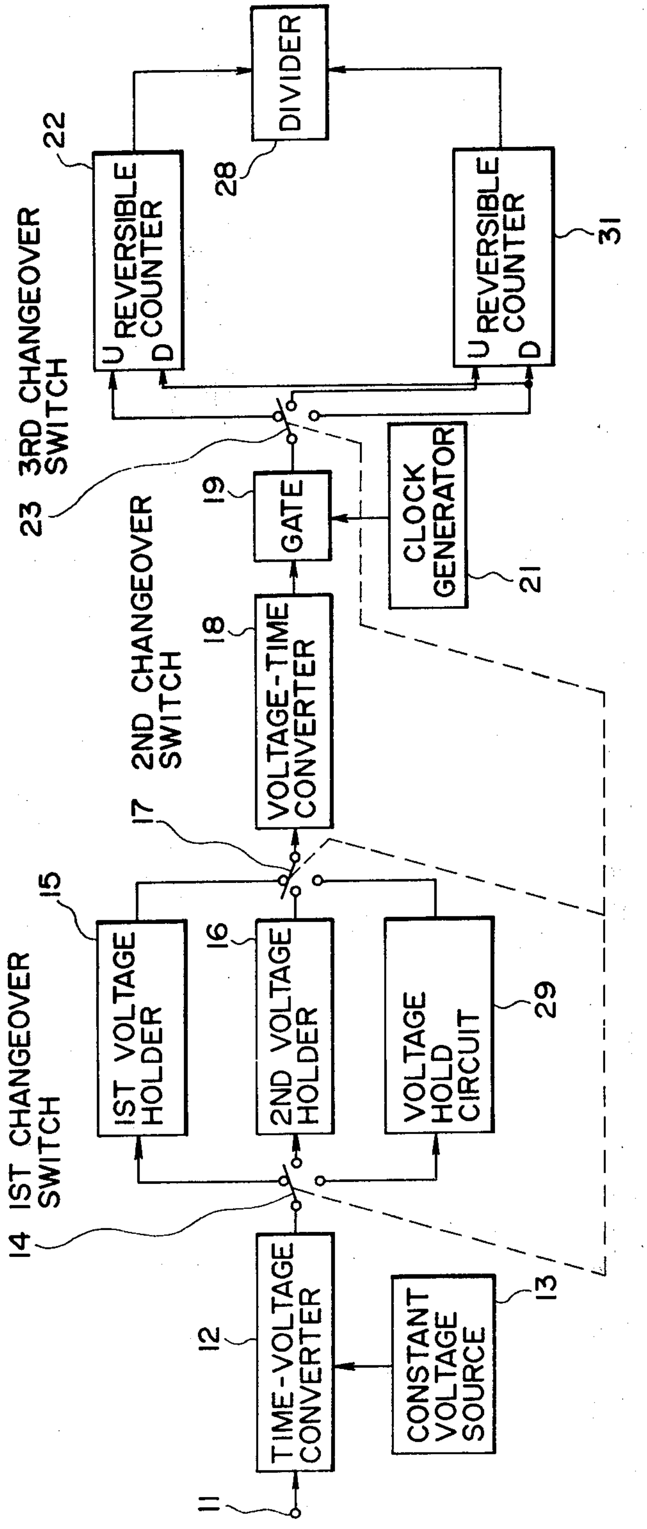
FIG. 5 is a block diagram explanatory of the construction of the time interval measuring instrument of this invention, which is adapted to be free from the influences of a nonlinear characteristic of the converter and variations in its conversion characteristic.

In order to compensate for the influences of the nonlinearity of the converters 12 and 18 and the variations in their conversion characteristics, use is made of the pulse of the duration $\Delta T_1+t_0$, a pulse of a constant duration $2t_0$ longer than the time $t_0$, and a pulse of the constant duration $t_0$, as shown in FIG. 3H, in the measurement of the time interval $\Delta T_1$. These three pulses are applied to the input terminal 11 in FIG. 5. In FIG. 5, the parts corresponding to those in FIG. 1 are identified by the same reference numerals. Another voltage holder 29 is provided in addition to voltage holders 15 and 16, and a converted voltage of the time interval $\Delta T_1+t_0$ is held in the voltage holder 15, whereas converted voltages of the time intervals $2t_0$ and $t_0$ are respectively held in the voltage holders 16 and 29. The voltage values of these voltage holders are supplied via the changeover switch 17 to the voltage-time converter 18. While the voltage held in the voltage holder 15 is converted to the corresponding time interval, the output from the gate 19 is provided via the changeover switch 23 to the reversible counter 22 to be counted up, thereby to obtain a value corresponding to the time $\Delta T_1+t_0$. Next, during the conversion of the voltage held in the voltage holder 16 to the corresponding time interval, the output from the gate 19 is supplied via the changeover switch 23 to a reversible counter 31 to be counted up, thereby to obtain a value corresponding to the time $2t_0$. Thereafter the changeover switch 17 is connected to the voltage holder 29 for conversion of its voltage to the corresponding time interval. During this conversion, the output from the gate 19 is applied via the switch 23 to both of the reversible counters 22 and 31 to be counted down. As a consequence, the counter 22 provides a value corresponding to $\Delta T_1+t_0-t_0$, whereas the counter 31 provides a value corresponding to $2t_0-t_0$. These count values are divided by the divider 28 to provide $\Delta T_1/t_0$. In this case, the measurement is free from not only the influence of the nonlinear characteristic of the time-voltage converter 12 but also the influence of the variations in the conversion characteristics of the time-voltage converter 12 and the voltage-time converter 18.

In a similar manner, the time $\Delta T_2$ in FIG. 3E can be measured without being affected by the nonlinearity of the conversion characteristic or/and its variations. Consequently, the time Tx in FIG. 3A can be measured accurately with a relatively simple and inexpensive construction. In the measurements of an ordinary very short time interval as well as those $\Delta T_1$ and $\Delta T_2$ shorter than one period of the clock pulse $t_0$ which occur at the beginning and the end of the time interval Tx to be measured, it is possible to prevent the influence of the nonlinearity of the conversion characteristic by measuring the very short time interval after adding thereto a constant time, measuring also the added constant time and then subtracting the measured value of the latter from the measured value of the former, as described above. Similarly, influence of the variations in the conversion characteristic can be avoided by obtaining measured values of the very short time interval and the added constant time, and providing the former in the form of a ratio to the latter. In these cases, the constant time need not always be $t_0$. Also, it is possible to employ the following method. Namely, the very short time interval is measured after being added with a first constant time, the first constant time and a second constant time (longer than the first one) are respectively measured, and then the difference between the measured values of the first constant time and the very short time interval to be measured is divided by the difference between the measured values of the first and the second constant time.

Figure 6:
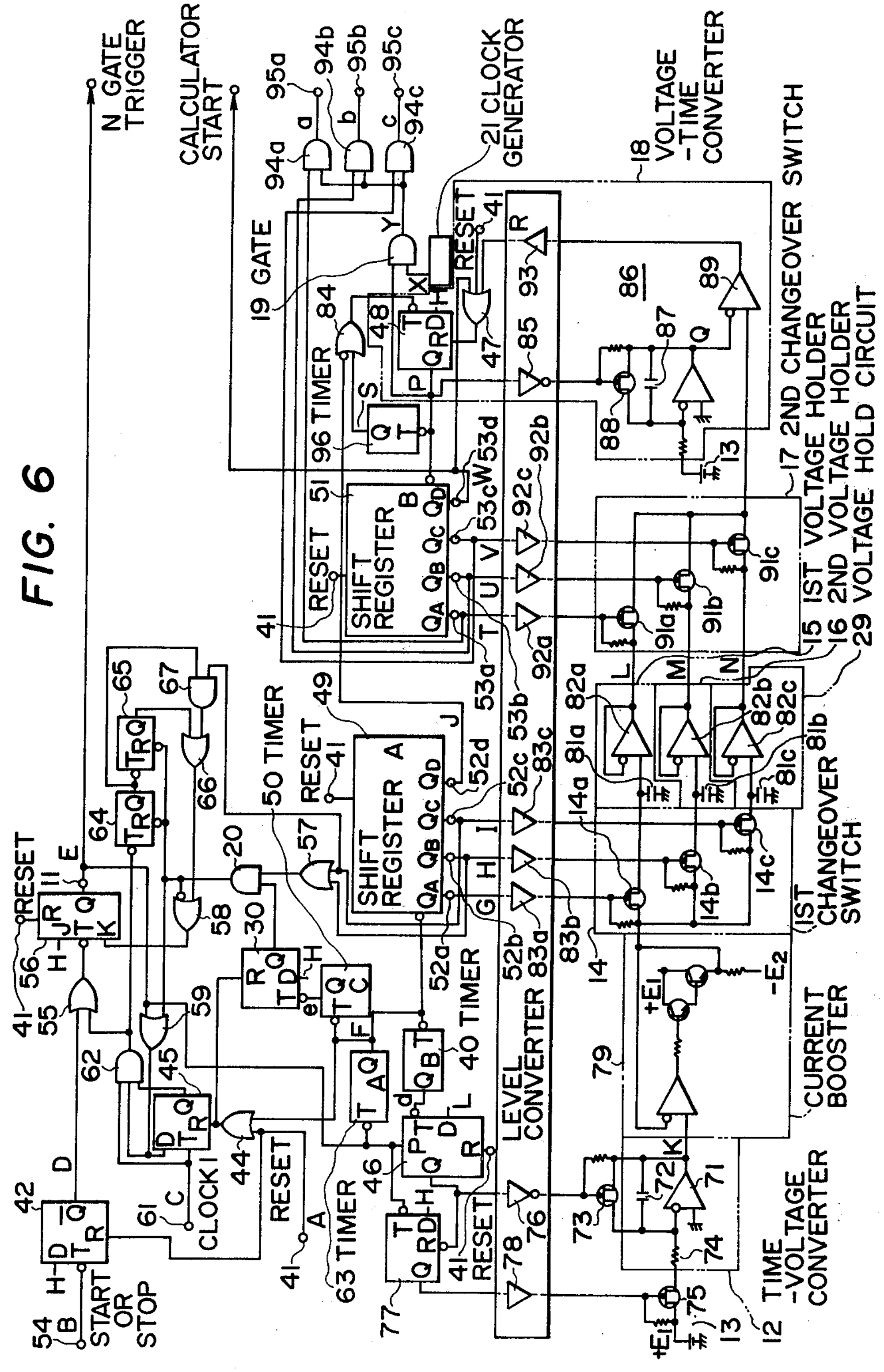
FIG. 6 is a circuit diagram illustrating a specific operative example of the time interval measuring instrument of the present invention.
Figure 7:
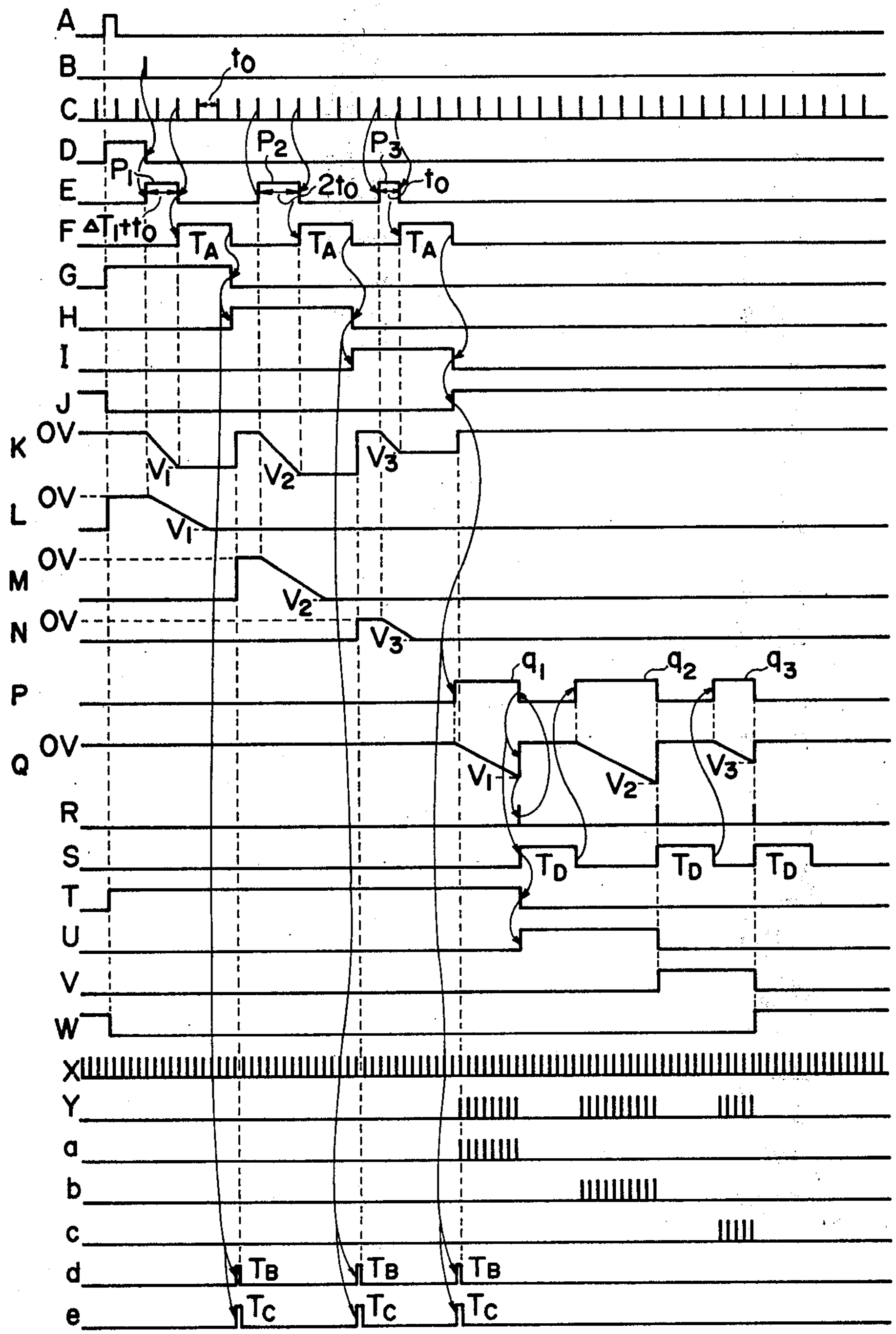
FIG. 7 is a timing chart explanatory of the operation of the example depicted in FIG. 6.

Referring next to FIGS. 6 and 7, a description will be made with regard to a specific operative example of the measurement of a very short time interval which is adapted in order to compensate for the nonlinearity of the time-voltage converter and the variations in its conversion characteristic. In FIG. 6, a reset pulse such as shown in FIG. 7A is applied to a terminal 41. This reset pulse resets a D flip-flop 42 to render its $\overline{Q}$ output high-level, as shown in FIG. 7D. At the same time, the reset pulse is applied via an OR gate 44 to a D flip-flop 45 to make its Q output low-level, and a D flip-flop 46 is also reset to make its Q output low-level. Further, the reset pulse is provided via an OR gate 47 to a D flip-flop 48 to render its Q output low-level, and shift registers 49 and 51 are reset to provide high-level outputs at their first-stage terminals 52*a* and 53*a*, respectively, as shown in FIGS. 7G and T. The JK flip-flop 56 is reset to make its Q output low-level, as shown in FIG. 7E.

In the above state, if such a pulse as shown in FIG. 7B which coincides with the leading edge of the time interval Tx in FIG. 3A is applied to a trigger terminal T of the flip-flop 42, the $\overline{Q}$ output of flip-flop 42 becomes low-level, as shown in FIG. 7D, since a high-level input is applied to a data terminal D of the flip-flop 42. The low-level output is provided via an OR gate 55 to a trigger terminal T of the JK flip-flop 56 to render its Q output high-level, as shown in FIG. 7E, since its terminal J is supplied with a high level H.

This high-level output is supplied to a data terminal D of the D flip-flop 45 via the input terminal 11 (in FIGS. 1 and 15) and an OR gate 59. A trigger terminal T of the flip-flop 45 is supplied, from a terminal 61, with first clock pulse of a period $t_0$ as shown in FIG. 7C which corresponds to the clock depicted in FIG. 3B. Before a high level is applied to the data terminal D of the flip-flop 45, its Q output remains low-level even if the clock pulse is applied to the trigger terminal T. When a high level is applied to the data terminal D, the Q output of the flip-flop 45 is made high-level by the first clock pulse occurring immediately after the application of the high level. This high level and that of the OR gate 59 are supplied to an AND gate 62. Consequently, the next first clock pulse from the terminal 61 is provided to the flip-flop 56 via the AND gate 62 and the OR gate 55. In this case, the outputs at second- and third-stage terminals 52*b* and 52*c* of the shift register 49 are low-level, as shown in FIGS. 7H and I, respectively, and those low-level outputs are applied to an OR gate 57, which, in turn, applies its low-level output to an AND gate 20. Accordingly, the output from the AND gate 20 is low-level and this output is inverted and then applied as a high-level input to the terminal K of the flip-flop 56 via an OR gate 58. As a consequence, when the clock pulse from the gate 62 is applied to the flip-flop 56, its output is inverted, as depicted in FIG. 7E. Thus, the pulse $P_1$ having the duration of $\Delta T_1+t_0$, as shown in FIG. 7E, is derived at the terminal 11.

The terminal 11 is connected with an input terminal T of a timer 63, so that upon falling of the pulse $P_1$, the timer 63 is driven to provide a high-level output, as depicted in FIG. 7F. The output from the timer 63 is provided via the OR gate 44 to the reset terminals R of the flip-flops 45 and 30. Accordingly, while the output from the timer 63 is high-level, the flip-flops 45 and 30 remain inoperative to hold their Q outputs low-level. On the termination of the operating time $T_A$ of the timer 63, its output turns low-level, as illustrated in FIG. 7F, and is applied to timers 40 and 50 and to the shift register 49, by which the outputs from the timers 40 and 50 are rendered high-level, as shown in FIGS. 7*d* and 7*e*, and the shift register 49 is shifted to yield a low-level output at its first-stage terminal 52*a*, as shown in FIG. 7G, and a high-level output at its second-stage terminal 52*b*, as shown in FIG. 7H. Consequently, one of the inputs to the AND gate 20 becomes high-level. When the output from the timer 50 becomes low-level at the end of its operating time $T_C$, the flip-flop 30 is driven by the low-level output to produce a high-level output, which is applied to the other input of the AND gate 20.

A high-level output from the AND gate 20 is supplied to a reset terminal R of each of cascade-connected flip-flops 64 and 65 to release them from their reset state. At the same time, the high-level output from the AND gate 20 is also provided via the OR gate 59 to the data terminal D of the flip-flop 45. Since the flip-flop 45 is released from its reset state when the output from the timer 63 becomes low-level, the Q output from the flip-flop 45 is made high-level by the next first clock pulse from the terminal 61 when the output from the AND gate 20 becomes high-level. As a consequence, the gate 62 is opened and, by the next first clock pulse from the terminal 61, the flip-flop 56 is inverted, permitting the pulse $P_2$ to rise, as shown in FIG. 7E. The clock pulse passing through the gate 62 is also applied to the flip-flop 64 to invert it, deriving therefrom a high-level output. Further, the next first clock pulse is provided via the gate 62 to the flip-flop 64 to invert it again to make its Q output low-level, by which the flip-flop 65 is inverted to render its Q output high-level. This high-level output is applied via OR gates 66 and 58 to the terminal K of the flip-flop 56. As a result of this, when the next first clock pulse passes through the gate 62, the flip-flop 56 is inverted to produce a low-level output, as illustrated in FIG. 7E. In this manner, the pulse $P_2$ comes to have a pulse width $2t_0$ twice as large as one period of the first clock pulse, providing a second time pulse in FIG. 3H.

By the fall of the pulse $P_2$, the timer 63 is driven again and, during its operating time, the flip-flop 45 and 30 are retained in their reset state, as described above. Accordingly, the Q output from the flip-flop 30 is low-level and the output from the AND gate 20 is also low-level, so that the flip-flops 64 and 65 are reset by the low-level output from the AND gate 20. When the output from the timer 63 becomes low-level again, as depicted in FIG. 7F, the timers 40 and 50 are driven and, at the same time, the shift register 49 is shifted to produce a high-level output at its third-stage output terminal 52c, as shown in FIG. 7I. This high-level output is also supplied to an AND gate 67, which is also supplied with the Q output from the flip-flop 64. When the output from the timer 63 becomes low-level so as to release the flip-flops 45 and 30 from their reset state, and when the output from the timer 50 becomes low-level, as described above, the Q output from the flip-flop 30 becomes high-level so as to cause the AND gate 20 to provide a high-level output. Accordingly, in the same manner as described above, the flip-flop 56 is inverted upon application of a second one of the subsequent first clock pulses from the terminal 61, and the output from the flip-flop 56 becomes high-level to produce a pulse $P_3$, as shown in FIG. 7E. At this time, the flip-flop 46 is also inverted to provide a high-level output, so that coincidence of the AND gate 67 is detected, and its high-level output is applied via the OR gate 66 and 58 to the terminal K of the flip-flop 56. Consequently, upon the next application of the first clock pulse to the terminal 61, the flip-flop 56 is inverted to make its output low-level, and the pulse width of the pulse $P_3$ becomes $t_0$, as shown in FIG. 7E. Thus, a third pulse in FIG. 3H is obtained.

The time-voltage converter 12 comprises an operational amplifier 71 and an integrating capacitor 72 connected between its input and output terminals, and an FET switch 73 is connected across the capacitor 72. An FET switch 75 is connected between an input resistor 74 of the operational amplifier 71 and a constant voltage source 13. In the initial state, the flip-flop 46 is held in its reset state and its Q output of low level is converted by a level converter 76 to a high-level output, which is applied to the gate of the FET switch 73. Accordingly, the FET switch 73 is in its ON state and the integrator making up the time-voltage converter 12 is held in its reset state. The low-level Q output from the flip-flop 46 is supplied to a reset terminal R of a flip-flop 77 to hold it in its reset state. The Q output from the flip-flop 77 remains low-level, and this low-level output is provided via a level converter 78 to the gate of the FET switch 75 to make it conductive. Further, the output side of the time-voltage converter 12, that is, the output side of the operational amplifier 71, is connected via a current booster 79 to one end of each of FET switches 14a, 14b and 14c making up the changeover switch 14. The other ends of the FET switches 14a, 14b and 14c are each connected to the input side of one of the voltage holders 15, 16 and 29 (i.e., one end of each of voltage hold capacitors 81a, 81b and 81c) and to one of buffer circuits 82a, 82b and 82c. The other ends of the capacitors 81a, 81b and 81c are grounded. In the initial state, the output at the first-stage terminal 52a of the shift register 49 is high-level, as described previously, and this high-level output is applied via a level converter 83a to the FET switch 14a to maintain it in the ON state.

The output from the flip-flop 56, that is, the time pulse to be measured which is supplied from the terminal 11, is applied to the timer 63, as described previously, and at the same time it is provided to a preset terminal P of the flip-flop 46 and to a trigger terminal T of the flip-flop 77, respectively. Accordingly, when the first pulse $P_1$ shown in FIG. 7E becomes high-level, the flip-flop 46 is preset to make its Q output high-level, so that the output from the level converter becomes low-level to turn OFF the FET switch 73. As a consequence, the integrator 12 starts its integrating operation to integrate a constant voltage from the constant voltage source 13 and the integrator output gradually lowers from a zero potential, as shown in FIG. 7K. This integrated output is current-amplified by the current booster 79, and is then provided to the changeover switch 14. In the changeover switch 14, only the FET switch 14a is in the ON state, as mentioned above, so that the output from the time-voltage converter 12 is charged in the capacitor 81a of the voltage holder 15 via the current booster 79.

When the Q output from the flip-flop 46 becomes high-level, the flip-flop 77 is released by the high-level output from the reset state, and consequently, when the pulse $P_1$ is terminated to become low-level, the flip-flop 77 is driven to read therein the high-level input to its data terminal D and the Q output from this flip-flop 77 becomes high-level. This high-level output is provided via the level converter 78 to the FET switch 75 to turn it OFF. As a result of this, the integrating operation of the time-voltage converter 12 stops, as shown in FIG. 7K, and the integrated voltage $v_1$ corresponding to the duration $\Delta T_1 + t_0$ of the pulse $P_1$ is charged in the capacitor 81a. The voltage of the capacitor 81a, that is, the output voltage of the buffer circuit 82a, follows the output from the time-voltage converter 12, as depicted in FIG. 7L. The operating time $T_A$ of the timer 63 is selected so that its operation comes to an end after the voltage held in the voltage holder 15 coincides with the converted voltage of the time-voltage converter, that is, the integrated voltage of the integrating capacitor 72 in the operating time $T_A$ of the timer 63. Thus, the voltage $v_1$ is accurately stored in the large-capacity capacitor 81*a* of the voltage holder 15, and this voltage does not change even if held for a relatively long time.

On the termination of the operating time $T_A$ of the timer 63, its output is applied to the timers 40 and 50 and to the shift register 49 to drive them, as referred to previously. As a consequence, the output at the first-stage terminal 52*a* of the shift register 49 turns low-level, as shown in FIG. 7G, and the FET switch 14*a* is turned OFF, holding the voltage $v_1$ in the voltage holder 15. Further, the output at the second-stage terminal of the shift register 49 turns high-level, as depicted in FIG. 7H, and this high-level output is provided via a level converter 83*a* to the gate of the FET switch 14*b* to turn it ON. Thereafter, when the operating time $T_B$ of the timer 40 ends, and its output becomes low-level, as shown in FIG. 7D, the flip-flop 46 is driven by the low-level output to read therein a low level L applied to its data terminal D, making its Q output low-level. This low-level output is applied to the FET switch 73 to turn it ON, by which the integrator 12 is reset, and its output rises to the zero level, as depicted in FIG. 7K. At the same time, the flip-flop 77 is reset to alter its Q output to a low-level one, turning ON the FET switch 75. After the charge stored in the capacitor 81*a* is discharged to the ground potential via the FET switch 14*b*, the operating time $T_C$ of the timer 50 comes to an end and its output becomes low-level, as depicted in FIG. 7*e*. As a result of this, the flip-flop 30 is driven by the output from the timer 50 and, upon occurrence of a second one of the subsequent first clock pulses, the Q output from the flip-flop 56 becomes high-level, as described previously. In other words, the second pulse $P_2$ is generated as referred to previously.

When this second pulse $P_2$ is provided to the flip-flop 46 to preset it, the integrating operation of the time-voltage converter 12 is started, as is the case with the first pulse $P_1$, and the converter output varies, as shown in FIG. 7K. The converter output is provided via the switch 14*b* to the capacitor 81*b* to be stored therein, as depicted in FIG. 7M. In this way, the voltage $v_2$ corresponding to the pulse width $2t_0$ of the second pulse $P_2$ is stored in the capacitor 81*b*, that is, in the voltage holder 16.

Then, after the second operating time $T_A$ of the timer 63 ends and the time-voltage converter 12 is reset, the third pulse $P_3$ is similarly applied to the flip-flop 46 from the terminal 11, with the result that the voltage $v_3$ corresponding to the pulse width of the pulse $P_3$ is stored in the capacitor 81*c* of the voltage holder 29. At this time, the third-stage terminal 52*c* of the shift register 49 provides a high-level output, which is applied via a level converter 83*c* to the FET switch 14*c* to make it conductive. The timer operating times $T_B$ and $T_C$ in FIGS. 7*d* and 7*e* are shown to be short but, in general, they are selected sufficiently longer than the period $t_0$ of the first clock pulse. In the manner described above, the voltages $v_1$, $v_2$ and $v_3$ converted from the pulse widths of the three pulses $P_1$, $P_2$ and $P_3$ are respectively held in the voltage holders 15, 16 and 29. Thereafter, at the end of the third operation of the timer 63, its output becomes low-level, by which the shift register 49 is shifted to provide a high-level output at its fourth-stage 52*d*, as depicted in FIG. 7J. In this state, the outputs at the terminals 52*b*, 52*c* are low-level and the output from the AND gate 20 is low-level, and the input to the terminal 11 is also low-level, so that the output from the OR gate 59 is low-level. Even if the first clock pulse is provided to the flip-flop 45 from the terminal 61, its Q output remains low-level and, as shown in FIG. 7E, the output from the flip-flop 56 does not become high-level.

The high-level output from the fourth terminal 52*d* of the shift register 49, shown in FIG. 7J, is inverted and then applied via an OR gate 84 to a trigger terminal T of the flip-flop 48. Accordingly, the Q output from the flip-flop 48 turns high-level, as shown in FIG. 7P, when the output at the terminal 52*d* becomes high-level. The high-level output from the flip-flop 48 is provided to a polarity level converter 85. An FET switch 88 is connected across a capacitor 87 of an integrator 86 forming a part of the voltage-time converter 18, and the output from the polarity and level converter 85 is applied to the gate of the FET switch 88 to turn it OFF, permitting the integrator 86 to start its integrating operation. The integrator 86 integrates the constant voltae of the constant voltage source 13, and the integrated output lowers from the zero level, as shown in FIG. 7Q. In FIG. 7, the integration speed of the integrator 86 is shown to be only a little lower than the integration speed of the time-voltage converter 12, but in practice, the integration speed of the former is selected to be, for example, 100 or 1000 times lower than the speed of the latter. That is, the integrator 86 performs its integrating operation very slowly.

The integrated output from the integrator 86 is provided to one of the input ends of a comparator 89, the other output end of which is supplied with the output from the changeover switch 17. The changeover switch 17 comprises, for instance, FET switches 91*a*, 91*b* and 91*c*, whose input sides are connected to the output sides of the voltage holders 15, 16 and 29, respectively, and whose output sides are connected in common to the input side of the comparator 89. To the gates of the FET switches 91*a*, 91*b* and 91*c*, there are provided the outputs from first, second and third output terminals 53*a*, 53*b* and 53*c*, respectively, of the shift register 51, these outputs being provided via level converters 92*a*, 92*b* and 92*c*. The shift register 51 is supplied with the Q output from the flip-flop 48 and is shifted whenever the Q output becomes low-level. In the initial state only, the output at the first terminal 53*a* is high-level, as shown in FIG. 7T, so that only the FET switch 91*a* of the changeover switch 17 is in the ON state. That is, the voltage $v_1$ of the voltage holder 15 is applied to the comparator 89.

Before the start of integration by the integrator 86, the input to the comparator 89 from the changeover switch 17 is larger in absolute value than the other input to the comparator 89, so that the comparator 89 produces a low-level output. However when the integrated value of the integrator 86 reaches the voltage $v_1$, the output from the comparator 89 is inverted to a high-level output, which is provided via a level converter 93 and the OR gate 47 to a reset terminal of the flip-flop 48. Accordingly, the flip-flop 48 is reset and its Q output becomes low-level, as shown in FIG. 7P, and a high-level input is applied to the gate of the FET switch 88 to turn it ON, resetting the integrator 86 and returning its output to the zero level, as depicted in FIG. 7Q. Accordingly, when the output from the integrator 86 reaches the voltage $v_1$, the output from the level converter 93 initiates a pulse, as shown in FIG. 7R.

Further, as described previously, when the output at the terminal 52*d* of the shift register 49 becomes high-level, the Q output from the flip-flop 48 rises to the high level to open a gate 19. Second clock pulses from the clock pulse generator 21, shown in FIG. 7X, pass through the gate 19 while the Q output from the flip-flop 48 remains high-level. The second clock pulse frequency is equal to or lower than the first clock pulse frequency. When the output from the integrator reaches the voltage $v_1$, the Q output from the flip-flop 48 turns down to the low level to close the gate 19, so that the gate output becomes such as depicted in FIG. 7Y. This gate output is applied to each of gates 94a, 94b and 94c, which are also supplied with the outputs from the terminals 53a, 53b and 53c of the shift register 51. Consequently, for the duration of a pulse $q_1$ which is derived first on the output side of the flip-flop 48, the second clock pulses are applied via the gate 94a to a terminal 95a by the number corresponding to the time interval $\Delta T_1 + t_O$, as shown in FIG. 7a.

When the Q output from the flip-flop 48 turns to the low level, as depicted in FIG. 7P, that is, by the fall of the pulse $q_1$, a timer 96 is driven to produce a high-level output, as shown in FIG. 7S. Upon termination of its operating time $T_D$, the timer 96 turns its output to the low level, which output is applied via the OR gate 84 to the trigger terminal T of the flip-flop 48 to render its Q output high-level again. Prior to this, when the Q output from the flip-flop 48 becomes low-level, the shift register 51 is shifted to provide a high-level output at its terminal 53b, as depicted in FIG. 7V, by which high-level output the FET switch 91b of the changeover switch 17 is turned ON, permitting the voltage $v_2$ held by the voltage holder 16 to be applied therefrom to the comparator 89. When the Q output from the flip-flop 48 rises to the high level for the second time, the integrator 86 operates in the same manner as described above, that is, as shown in FIG. 7P, the integrator 86 starts its integrating operation upon occurrence of a second pulse $q_2$ from the flip-flop 48. At the same time, the gate 19 is opened and the gate 94b is also opened, so that the second clock pulses from the clock pulse generator 21, shown in FIG. 7X, are applied via the gates 19 and 94b to a terminal 95b for the duration of the pulse $q_2$, as depicted in FIG. 7b. When the integrated value of the integrator 86 becomes equal to the voltage $v_2$ of the voltage holder 16, the output from the comparator 89 is inverted to reset the flip-flop 48 as is the case with the above. Consequently, the gate 19 is closed and there are obtained, at the terminal 95b, the second clock pulses corresponding in number to the duration $2t_O$ of the second pulse $P_2$ shown in FIG. 7E.

In a similar manner, the Q output from the flip-flop 48 becomes low-level and the shift register 51 produces a high-level output at its third terminal 53c, as shown in FIG. 7V, thereby turning ON the FET switch 91c. Further, the timer 96 is started and, after its operating time $T_D$, the Q output from the flip-flop 48 rises to the high level again, generating a third pulse $q_3$. Upon occurrence of the pulse $q_3$, the integrator 86 starts its integrating operation and, when the integrated voltage becomes equal to the voltage $v_3$ held by the voltage holder 29, the output from the comparator 89 is inverted to reset the flip-flop 48. As a consequence, the number of second clock pulses corresponding to the duration $t_O$ of the third pulse $q_3$ shown in FIG. 7E is obtained at a terminal 95c. Next, when the flip-flop 48 is reset again, the shift register 51 provides a high-level output at its fourth terminal 53d, as shown in FIG. 7W, which output is applied via the OR gate 47 to the reset terminal R of the flip-flop 48 so as to reset it, and, even if the output from the timer 96 becomes low-level, the flip-flop 48 is not driven.

Thus, there are provided at the terminals 95a, 95b and 95c the numbers of clock pulses corresponding to the first, second and third time intervals, respectively shown in FIG. 3H. Then, as described previously with respect to FIG. 5, these clock pulses are counted by the reversible counters 22 and 31, that is, the clock pulses at the terminals 95a and 95b are up-counted by the counters 22 and 31, respectively and then the clock pulses at the terminal 95c are down-counted by the counters 22 and 31. Thereafter, these count values are divided by the divider 28. Thus, highly accurate time interval measurements can be achieved, which measurements are free from the nonlinear characteristic of the time-voltage converter 12, and from variations in the conversion characteristics of the converters 12 and 18, which variations are caused by the ambient temperature and the like.

Figure 8:
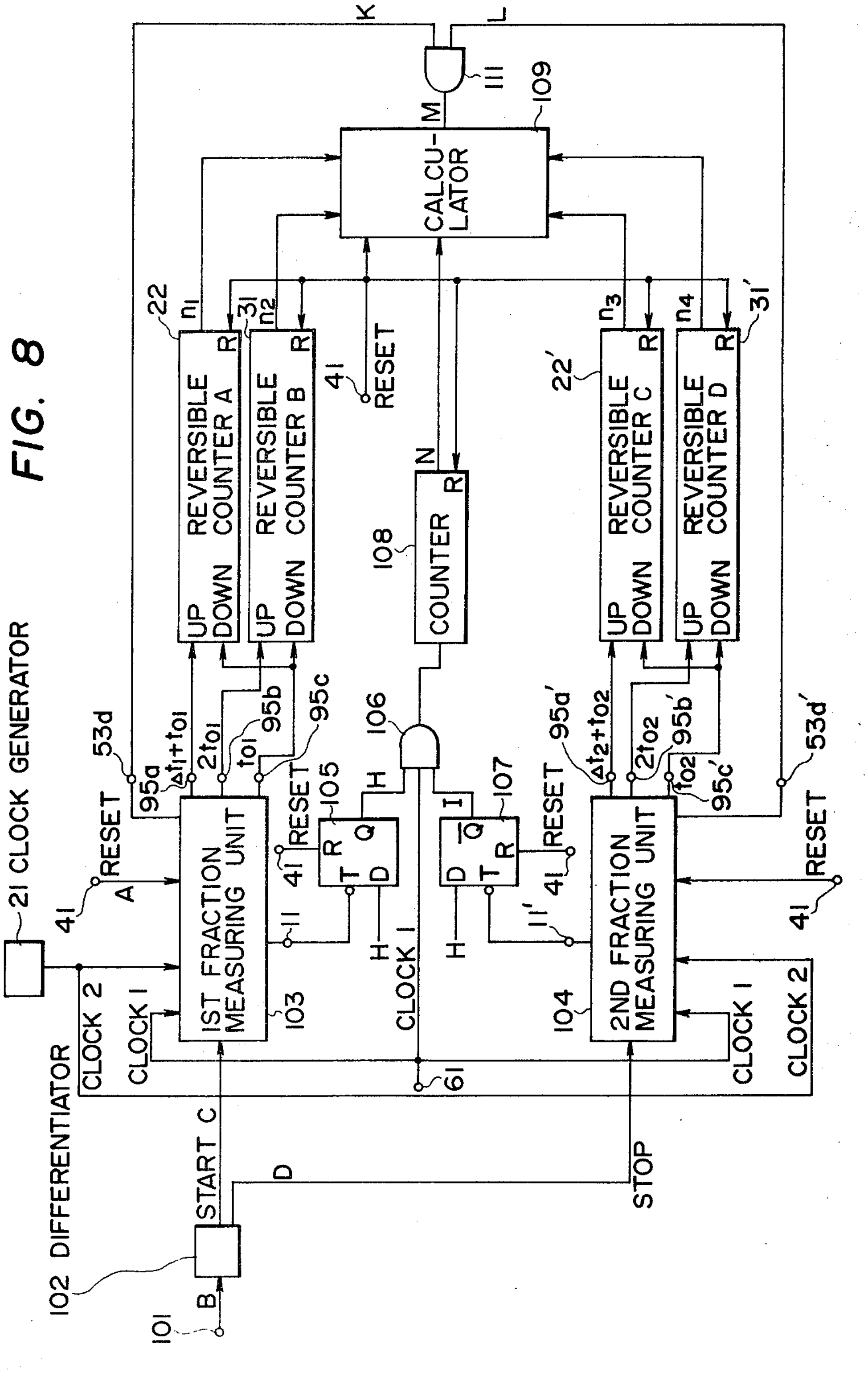
FIG. 8 is a block diagram showing an example of measuring a relatively long time interval with high accuracy.
Figure 9:
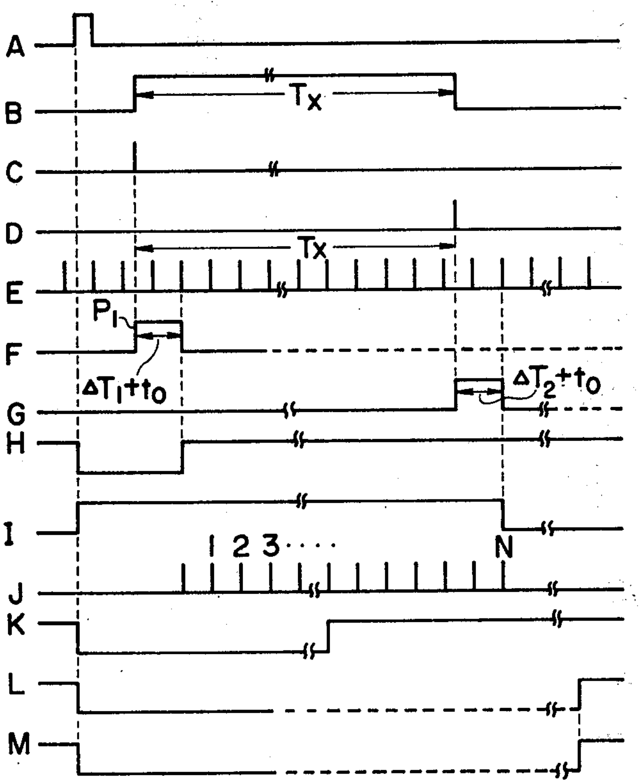
FIG. 9 is a timing chart explanatory of the operation of the embodiment of FIG. 8.

Turning next to FIGS. 8 and 9, a description will be made of the measurement of the time interval Tx of FIG. 3A by making use of the above-described method for measuring such very short time intervals. In FIG. 8, such a reset pulse as depicted in FIG. 9A is applied from a terminal 41 to reset the measuring instrument to its initial state. In this state, a pulse of the time interval Tx to be measured, shown in FIG. 9B, is provided from a terminal 101 to a differentiator 102, from which the differentiated outputs respectively corresponding to the rise and fall of the input pulse, such as shown in FIGS. 9C and 9D, are applied to first and second fraction measuring units 103 and 104, respectively. The fraction measuring units 103 and 104 are each identical in construction to the measuring circuit illustrated in FIG. 6. Accordingly, they are supplied with the reset pulses from the terminal 41, the first clock pulses from the terminal 61, and the second clock pulses from the clock generator 21.

In the fraction measuring unit 103, the pulses $P_1$, $P_2$ and $P_3$ shown in FIG. 7E are produced in the manner described previously, and the numbers of second clock pulses corresponding to the durations of the pulses $P_1$, $P_2$ and $P_3$ are derived at the terminals 95b, 95b and 95c, respectively. The clock pulses at the terminals 95a and 95c are respectively up-counted by the reversible counters 22 and 31, whereas the clock pulses at the terminal 95c are down-counted by the counters 22 and 31. The output at output terminal 56 of FIG. 6 in the fraction measuring unit 103 is applied to a trigger terminal T of a flip-flop 105 to reset it in advance, and a high-level input is applied to its data terminal D. Accordingly, the Q output from the flip-flop 105 is rendered high-level, as shown in FIG. 9H, by the fall of the first pulse $P_1$ (FIG. 9F) from the terminal 11, and the high-level output is applied to a gate 106. On the other hand, the $\overline{Q}$ output from a flip-flop 107, which is reset in advance by the reset pulse from the terminal 41, is applied as a high-level input (FIG. 9I) to the gate 106. At the same time, the gate 106 is also supplied with the first clock pulses, shown in FIG. 9E, from the terminal 61. Accordingly, from the moment of the fall of the first pulse $P_1$, the first clock pulses pass through the gate 106 and are counted by a counter 108.

In the second fraction measuring unit 104, the pulse (FIG. 9D) occurring at the end of the time interval Tx is provided, by which are produced pulses similar to the first, second and third pulses $P_1$, $P_2$ and $P_3$. And the second clock pulses corresponding in number to the durations of such pulses respectively appear at terminals 95a', 95b' and 95' corresponding to elements 95a, 95b and 95*c* in FIG. 6. In other words, there are provided at the terminal 95*a*' the second clock pulses of a number corresponding to the duration of a pulse, shown in FIG. 9G, which is the sum of the time interval $\Delta T_2$ occurring between the end of the time interval Tx and the next successive first clock pulse, and the period $t_O$ thereof. At the terminals 95*b*' and 95*c*' there are respectively obtained the second clock pulses of numbers corresponding to the pulse width $2t_O$. and $P_O$, respectively. Then, as is the case with FIG. 6, the second clock pulses derived at the terminals 95*a*' and 95*b*' are up-counted by reversible counters 22' and 31', respectively and their count values are then down-counted by the second clock pulses at the terminal 59*c*. From the second fraction measuring unit 104, pulses are applied to a trigger terminal T of the flip-flop 107 via a terminal 11' corresponding to terminal 11 in FIG. 6 and, by the fall of the pulse (FIG. 9G) corresponding to the first one $P_1$ of the pulses, a high level is read in the flip-flop 107 to render its $\overline{Q}$ output low-level, as depicted in FIG. 9I. As a result, the counting of the first clock pulses by the counter 108 comes to an end.

The count values $n_1$ and $n_2$ of the counters 22 and 31, respectively, the count values $n_3$ and $n_4$ of the counters 22' and 31' and the count value N of the counter 108 are provided to a calculator 109. After obtaining, at the terminal 95*c*, the second clock pulses of a number corresponding to the duration of the third pulse $P_3$ (FIG. 7E) in the first fraction measuring unit 103, the shift register 51 produces a high-level output at its fourth terminal 53*d*, which high-level output is supplied to an AND gate 111 in FIG. 8, as shown in FIG. 9K. The AND gate 111 is also supplied with the output from the corresponding terminal 53*d*' of the second fraction measuring unit 104, as shown in FIG. 9L. Accordingly, when both inputs to the AND gate 111 become high-level, its output becomes high-level, permitting the calculator 109 to start its calculating operation. In the calculator 109, the expression $(N+n_1/n_2-n_3/n_4)\times 10^k$ is calculated, where K is a positive integer determined by a factor of accuracy. The calculated result is the time interval Tx desired to be obtained, which is stored in a register of the calculator 109, and which is displayed on a display included in the calculator 109.

Thus, in the case where the time interval Tx to be measured is relatively long, the counter 108 may be one that has a relatively small number of stages, that is, the frequency of the first clock pulse may be relatively low, and consequently the counter 108 may be an inexpensive one. In addition, the fractions $\Delta T_1$ and $\Delta T_2$ which are less than one period of the first clock pulse, and which occur at the start and the end of the time interval to be measured, can be measured by the fraction measuring units 103 and 104 at high speed. This measurement can be achieved with high accuracy by expanding the very small time widths and by employing the second clock pulse of a relatively low frequency, as described previously. Further, for preventing the influences of the nonlinearity of the converters and variations in their conversion characteristics, it is necessary to measure two pulses of constant durations for each very short time interval to be measured. However even if the pulses are generated relatively close to each other, they can be measured accurately by common converters, using voltage holders. Besides, there is no need for housing the converters in a constant-temperature oven for preventing the influence of temperature variations, so that the measuring instrument is markedly inexpensive as a whole.

In FIG. 6, it is also possible to omit the FET switch 75 by connecting, for example, a diode in series with the output side of the time-voltage converter 12, connecting the constant voltage 13 directly to the converter 12, and controlling the FET switch 73 directly by the pulse shown in FIG. 7E. In this case, however, when turning ON the FET switch 73 for resetting the capacitor 72, charges stored up to that point in the capacitor 72 are discharged via the switch 73, so that a certain time, although very short, is nevertheless needed for complete resetting of the capacitor 72. In this time interval, too, the integrating operation, though very slight, is carried out, introducing the possibility of the time-to-voltage conversion becoming inaccurate. But, if the integrating operation is stopped by turning OFF the FET switch 75, as shown in FIG. 6, the integration is stopped instantaneously, and this enables measurements to be of very high accuracy.

Moreover, as in the specific operative example of the voltage-time converter 18 shown in FIG. 6, in the case where, at the start of its converting operation, a signal indicating the start is applied to the flip-flop 48 to start the integrating operation of the integrator 86, and the flip-flop 48 is reset when the integrated output agrees with the voltage to be converted, only one comparator is used, and hence the entire structure can be simplified by that technique. In addition, in the next measurement as well, upon detection of coincidence by the comparator, the flip-flop 48 is reset to thereby reset the integrator 86, therefore, the next conversion can be immediately achieved, and consequently the entire measuring time can be shortened.

In the foregoing, the time-voltage conversion, the switching of the voltage holders, and the voltage time conversion are controlled by control circuitry, but since they are controlled by sequential operations, their control can also be achieved programmatically by the employment of the so-called microcomputer.

It will be apparent that many modifications and variations may be effected without departing from the scope of the novel concepts of this invention.

What is claimed is:

1. A time interval measuring instrument for measuring successive time intervals corresponding to respective ones of a plurality of successive pulses and providing a count output accordingly, comprising:

time-voltage converter means supplied with said plurality of successive pulses and having a conversion characteristic for converting each respective one of said plurality of successive pulses to corresponding respective voltages, said time-voltage converter means having an output for providing said converted successive pulses as respective successive conversion voltages;

a plurality of voltage holders, each having an input and an output;

first changeover switch means for connecting the output of the time-voltage converter means to the inputs of the plurality of voltage holders in a sequential order so as to supply thereto the respective successive conversion voltages one after another, said respective successive conversion voltages each being held in and provided as an output of a corresponding one of said plurality of voltage holders;

voltage-time converter means having an input for receiving and converting an input voltage to a time interval with such a conversion characteristic as to convert the input voltage to a time interval longer than that previously converted by the time-voltage converter means;

second changeover switch means for connecting the outputs of the plurality of voltage holders in a sequential order to the input of the voltage-time converter means, so as to cause conversion of said successive conversion voltages, provided as an output of said corresponding one of said plurality of voltage holders, to pulse waveforms representing respective converted time intervals;

generating means for generating clock pulses including first clock pulses; and counting means for counting the number of first clock pulses generated during each respective time interval corresponding to each of said waveforms converted by the voltage-time converter means, said counting means providing the count value output.

2. A time interval measuring instrument according to claim 1, wherein the time-voltage converter means comprises a constant voltage source providing a constant voltage output, and a first integrator for integrating said constant voltage output from said constant voltage source for each successive time interval to be measured.

3. A time interval measuring instrument according to claim 2, wherein said first integrator includes an integrating capacitor, said first integrator being switchably connected to successive ones of said plurality of voltage holders by said first changeover switch means, wherein a first switch having ON and OFF states is connected between the constant voltage source and the first integrator, wherein a second switch having ON and OFF states is connected in parallel to said integrating capacitor of the first integrator, and wherein there is provided a control circuit for controlling the first and second switches so that, while the output of the first integrator is switchably connected to one of the voltage holders, the second switch is turned OFF to permit the integrating operation of the first integrator starting at the beginning of each time interval to be measured; wherein, at the end of the time interval to be measured, the first switch is turned OFF to stop the integrating operation; and wherein, when the output of the first integrator is switchably connected to the other voltage holder, the first and second switches are both turned ON.

4. A time interval measuring instrument according to claim 2, wherein said first integrator provides an integrated output, said instrument further comprising a current booster 5. A time interval measuring instrument according to claim 1, wherein the voltage-time converter means comprises:

flip-flop means for selectively providing an inverted or non-inverted output in accordance with the reception of one of said input voltages which has not been converted to a time interval, a second integrator which is selectively reset by the non-inverted output from the flip-flop and which is selectively started by the inverted output from the flip-flop so as to integrate a constant voltage, and a comparator for comparing the output from the second integrator and the output from the second changeover switch to develop an inverted compared output, and for resetting the flip-flop by means of said inverted compared output.

6. A time interval measuring instrument according to claim 1, which further includes control means for controlling the time-voltage converter means and the first changeover switch means so that, after one of the successive time intervals to be measured is converted by the time-voltage converter means connected to one of the plurality of voltage holders, the first changeover switch means is actuated to newly connect the time-voltage converter means to another one of said plurality of voltage holders, and then the time-voltage converter means is reset; and wherein, after the voltage held by the newly connected another one of said plurality of voltage holders returns to a reference voltage, the next time interval to be measured is converted by the time-voltage converter means.

7. The timer of claim 1, further comprising a third voltage holder operatively connected to said first and second changeover switch means parallel to said first and second voltage holders, wherein said pulse generating means further generates a third time interval T3 sequentially after said second time interval T2, said third time interval T3 being equal to a constant time and being longer than said constant first time interval, wherein said time-voltage converter means generates a third voltage corresponding to said third time interval T3 after said second voltage corresponding to said second time interval T2, wherein said first changeover switch means further sequentially connects said time-voltage converter means to said third voltage holder, so that said third voltage is supplied to said third voltage holder, wherein said second changeover switch means sequentially connects said third voltage holder to said voltage-time converter, after said second voltage holder has been connected to said voltage-time converter, wherein said voltage-time converter further generates a third expanded time interval corresponding to said third voltage and to said third time interval T3, and wherein said calculating means further counts the number of clock pulses occurring during said third expanded time interval and calculates a second difference comprising the difference between the number of clock pulses counter during said third and first expanded time intervals, respectively, and said calculating means further calculates the ratio between said second difference and said difference between the number of clock pulses counted during said second expanded time interval and said first expanded time interval and outputs said ratio as a proportionate measurement of said time interval $\Delta T$.

8. The timer of claim 7, wherein said calculting means further comprises:

first and second reversible counter means for counting up the number of clock pulses received during said second and third expanded time intervals respectively, and for counting down the number of clock pulses received during said first expanded time interval, and dividing means, for dividing the count value of said second reversible counter by the count value of said first reversible counter.

9. An interval-expanding timer, for measuring a time interval T, comprising:

clock means for continuously generating a plurality of equally spaced clock pulses;

adding means for adding the time interval ΔT to be measured to a constant first time interval T1 to form a second time interval T2;

pulse generating means, operatively connected to said adding means, for generating said first time interval T1 and said second time interval T2 sequentially as pulses;

time-voltage converter means, operatively connected to said pulse generating means, for converting said first and second time intervals T1 and T2 sequentially to first and second voltages, respectively, said first time interval T1 being selected to be sufficiently large that said time-voltage converter operates linearly;

first and second voltage holders;

first changeover switch means, operatively connected to said time-voltage converter means and to said first and second voltage holders, for connecting the output side of said time-voltage converter means to the input sides of said first and second voltage holders sequentially, so as to supply said first and second voltages corresponding to time intervals T1 and T2, respectively, to said first and second voltage holders, respectively;

voltage-time converter means for converting a voltage input intput which may be received to a time interval output, the conversion characteristics of said voltage-time converter means being such that the time interval output of said voltage-time converter means corresponding to a given voltage input is longer than the time interval input of said time-voltage converter means which corresponds to a given output of said time-voltage converter means;

second changeover switch means, operatively connected to said voltage-time converter means and to said first and second voltage holders, for connecting the output sides of said first and second voltage holder sequentially to the input side of said voltage-time converter means, so that said voltage-time converter means outputs first and second expanded time intervals respectively corresponding to said first and second voltages, and also respectively corresponding to said first and second time intervals T1 and T2;

calculating means, operatively connected to said voltage-time converter means and to said clock means, for counting the number of said clock pulses received from said clock means during said first expanded time interval, for counting the number of clock pulses received during said second expanded time interval, and for outputting the difference therebetween as a measurement of the time ΔT.

10. An interval-expanding timer, for measuring a time interval ΔT, comprising:

clock means for continuously generating a plurality of equally spaced output pulses;

pulse generating means for sequentially generating a first time interval T1 which is equal to a constant time, and a second time interval T2 which is equal to the time interval ΔT to be measured;

time-voltage converter means, operatively connected to said pulse generating means, for converting said first and second time intervals T1 and T2 to first and second voltages, respectively;

first and second voltage holders;

first changeover switch means, operatively connected to said time-voltage converter means and to said voltage holders, for connecting the output side of said time-voltage converter means to the input sides of said first and second voltage holders, so as to supply said first and second voltages corresponding to said time intervals T1 and T2, respectively, to said first and second voltage holders, respectively;

voltage-time converter means for converting an input voltage to a time interval, the conversion characteristics of said voltage-time converter means being such that the output time interval which corresponds to an input voltage received by said voltage-time converter means is longer than the input time interval which corresponds to an output voltage generated by said time-voltage converter means;

second changeover switch means, operatively connected to said voltage holders and to said voltage-time converter means, for connecting the output sides of said first and second voltage holders sequentially to the input side of said voltage-time converter means, so that first and second expanded time intervals corresponding, respectively, to said first and second voltages and, respectively, to said first and second time intervals T1 and T2, are sequentially generated by said voltage-time converter means;

counting means, operatively connected to said voltage-time converter means and to said clock means, for counting the number of clock pulses during said first and second expanded time intervals, respectively, and for outputting first and second count values corresponding to said first and second time intervals, respectively;

dividing means for calculating a ratio between said first and second count values, and for outputting said ratio as an index of said time interval ΔT in proportion to said constant first time interval T1.

11. The timer of claim 9, 10, or 7, wherein said time voltage converter comprises:

a constant voltage source;

a first switch, connected to said constant voltage source;

a first integrator connected to said first switch, and to said constant voltage source through said first switch, for integrating the constant voltage received from said constant voltage source during each said time interval to be converted, said first integrator further comprising an integrating capacitor;

a second switch, connected in parallel with said integrating capacitor of said first integrator; and control circuit means for controlling said first and second switches, so that, while the output side of said first integrator is connected to one of said voltage holders, said second switch is turned off to permit the integrating operation of said first integrator to start at the beginning of each said time interval to be converted, so that, at the end of each said time interval to be converted, said first switch is turned off to stop the integrating operation, and so that, when the output side of said first integrator is connected to another of said voltage holders, said first and second switches are both turned on.

12. The timer of claim 11, further comprising a current booster, connected between the output side of said first integrator in said first changeover switch, for current amplifying the integrated output from said first integrator.

13. The timer of claim 9, 10, or 7, wherein said voltage-time converter means comprises:

a flip-flop comprsing a selectively invertable output;

an integrator, which may be reset by the non-inverted condition of said output of said flip-flop, and which may be started by the inverted condition of said output of said flip-flop, said integrator further comprising a constant voltage source which is integrated by said integrator when said integrator has been started; and comparator means for comparing the output from said integrator and the output from said second changeover switch, and for resetting said flip-flop in accordance with said comparison.

14. The timer of claim 9, 10, or 7, further comprising:

control means, operatively connected to said time-voltage converter and to said first changeover switch, for selectively actuating said first changeover switch (so that, after one of said time intervals to be converted has been converted by said time-voltage converter while connected to one of said voltage holders, said first changeover switch is actuated to connect said time-voltage converter to another one of said voltage holders), and for simultaneously resetting said time-voltage converter.

15. The timer of claim 9, 10, or 7, for measurement of a relatively long time interval Tx, wherein the duration between the beginning of said interval Tx and the occurrence of the second clock pulse thereafter is defined as a first time interval ΔT1 to be measured, and the duration between the end of said interval Tx and the occurrence of the second clock pulse thereafter is defined as a second time interval ΔT2 to be measured, and further comprising means for counting the number of clock pulses during said time interval Tx, and means for calculating the duration of said time interval Tx in accordance with the count value of said time interval Tx and the count values for said respective time intervals ΔT1 and ΔT2.

16. An interval-expanding timer, for measuring a relatively long time interval Tx, comprising:

clock means for generating clock pulses at approximately constant intervals;

timing means, operatively connected to said clock means, for measuring and outputting a first time interval ΔT1 between the beginning of the relatively long time interval Tx to be measured and the occurrence of the second clock pulse reecived from said clock means thereafter, and for measuring and outputting a second time interval ΔT2 between the end of the time interval Tx and the occurrence of the second clock pulse received from said clock means thereafter;

pulse generating means, operatively connected to said timing means, for outputting said first time interval ΔT1 and said second time interval ΔT2 sequentially;

time-voltage converter means, operatively connected to said pulse generating means, for converting said first and second time intervals ΔT1 and ΔT2, respectively, to first and second voltages;

first and second voltage holders;

first changeover switch means for connecting said first and second voltages sequentially, as they are outputted by said time-voltage converter means, to said first and second voltage holders;

voltage-time converter means for converting an input voltage to a time interval, the conversion characteristics of said voltage-time converter means being such that the time interval which corresponds to any given voltage which is received by said voltage-time converter means is longer than the time interval which corresponds to any given voltage outputted by said time-voltage converter means;

second changeover switch means for connecting said first and second voltage holders sequentially to said voltage-time converter means, so that said first and second voltages are sequentially inputted to said voltage-time converter means; and calculating means for counting the number of clock pulses during the output of said voltage-time converter means which corresponds to said first voltage, for counting the number of clock pulses during the time interval output of said voltage-time converter means which corresponds to said second voltage, for reducing said counted value corresponding to said second voltage by said counted value corresponding to said first voltage, for scaledly adding thereto the number of clock pulses which occurred during said time interval Tx, and for outputting the results thereof as a time interval measurement of said interval Tx.

* * * * *

UNITED STATES PATENT AND TRADEMARK OFFICE

CERTIFICATE OF CORRECTION

PATENT NO. : 4,267,436
DATED : 12 May 1981
INVENTOR(S) : MISHIO HAYASHI

It is certified that error appears in the above—identified patent and that said Letters Patent is hereby corrected as shown below:

Front page, between [76] and [21] insert:
--[73] Assignee: Takeda Riken Kogyo Kabushikikaisha, Tokyo, Japan--;
[56] References cited, U.S. Patent Documents, the reference "Meyer" has no area of search listed;
Other Publications, in Murthy et al., "Measure" should be --Measurement--, and "Inse" should be --Inst.--;
in Rarity et al., "Measure" should be --Measurement--.

Col. 1, between lines 3 and 4 insert:
--1. Field of the Invention--;
between lines 7 and 8 insert:
--2. Description of the Prior Art--;
line 61, ", and counters" should be --and counters,--.
Col. 3, line 29, "lack" should be --each--;
line 35, "voltaged" should be --voltages--.
Col. 5, line 17, delete "being";
line 35, "during" should be --in--; "in a" should be --during a--;

UNITED STATES PATENT AND TRADEMARK OFFICE

CERTIFICATE OF CORRECTION

PATENT NO. : 4,267,436

DATED : 12 May 1981

INVENTOR(S) : MISHIO HAYASHI

It is certified that error appears in the above—identified patent and that said Letters Patent is hereby corrected as shown below:

Col. 5, line 46, "explained" should be --expanded--;
line 48, delete "as";
line 53, after "However" insert --,--;
line 56, "converson" should be --conversion--.
Col. 6, line 4, "12," should be --12;--;
line 36, "represent" should be --represents--;
line 37, "$t_0$" should be --$t_0$,--.
Col. 8, line 6, "The" should be --A--;
line 21, after "with" insert --a--.
Col. 9, line 55, "gate" should be --gates--.
Col. 11, line 65, "52b," should be --52 b and--;
"low-level and" should be --low-level,--.
Col. 12, line 16, "voltae" should be --voltage--;
line 41, "only," should be --, only--;
line 51, after "However" insert --,--.
Col. 14, lines 3 and 8 after "respectively" insert --,--;
line 41, "95b" should be --95a--;
line 43, "95c" should be 95b--.
Col. 15, line 6, "$t_0$" should be --$t_0$--;
line 9, "2$t_0$." should be --2$t_0$--;
line 12, after "respectively" insert --,--;
line 25, after "31'" insert --, respectively,--;
line 62, after "However" insert --,--.

UNITED STATES PATENT AND TRADEMARK OFFICE

CERTIFICATE OF CORRECTION

PATENT NO. : 4,267,436

DATED : 12 May 1981

INVENTOR(S) : MISHIO HAYASHI

It is certified that error appears in the above—identified patent and that said Letters Patent is hereby corrected as shown below:

Col. 16, line 32, "86," should be --86;--.
Col. 17, line 53, after "booster" insert:
--connected between the output of the first integrator and the first changeover switch for current amplifying the integrated output from the first integrator.--.
Col. 18, line 49, "counter" should be --counted--;
line 58, "calculting" should be --calculating--.
Col. 19, line 2, "T," should be -- $\Delta$T,--;
line 30, delete "intput";
line 43, "holder" should be --holders--.
Col. 21, line 10, "comprsing" should be --comprising--.

Signed and Sealed this

***Thirtieth* Day of *March 1982***

[SEAL]

*Attest:*

GERALD J. MOSSINGHOFF

*Attesting Officer* *Commissioner of Patents and Trademarks*